(12) United States Patent
Bi

(10) Patent No.: US 8,081,031 B2
(45) Date of Patent: Dec. 20, 2011

(54) EQUALIZATION SYSTEM WITH STABILIZED PEAKING GAIN FOR A COMMUNICATION SYSTEM

(75) Inventor: Han Bi, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 1 day.

(21) Appl. No.: 12/687,861

(22) Filed: Jan. 14, 2010

(65) Prior Publication Data

US 2011/0169574 A1  Jul. 14, 2011

(51) Int. Cl.
*H03F 3/04* (2006.01)
(52) U.S. Cl. .................... 330/304; 330/303
(58) Field of Classification Search .............. 330/304, 330/303, 289, 310, 98, 150
See application file for complete search history.

(56) References Cited

U.S. PATENT DOCUMENTS

| | | | | |
|---|---|---|---|---|
| 4,293,823 A * | 10/1981 | Hochberg et al. | ............. | 330/260 |
| 4,684,899 A * | 8/1987 | Carpentier | ................ | 330/149 |
| 4,792,977 A * | 12/1988 | Anderson et al. | .............. | 381/321 |
| 6,188,279 B1 * | 2/2001 | Yuen et al. | ................ | 330/149 |
| 7,076,229 B2 * | 7/2006 | Wang | ................ | 455/296 |
| 2007/0063757 A1 * | 3/2007 | Bouras | ................ | 327/307 |
| 2010/0130158 A1 * | 5/2010 | Khoini-Poorfard et al. | .. | 455/337 |

OTHER PUBLICATIONS

Jong-Sang Choi, Moon-Sang Hwang, A 0.18-$\mu$m CMOS 3.5 Gb/s Continuous-Time Adaptive Cable Equalizer Using Enhanced Low-Frequency Gain Control Method, IEEE Journal of Solid-State Circuits, Mar. 2004, pp. 419-425, vol. 39, No. 3, © 2004 IEEE.

Troy Beukema, et al., A 6.4-Gb/s CMOS SerDes Core with Feed-Forward and Decision-Feedback Equalization, IEEE Journal of Solid-State Circuits, Dec. 2005, pp. 2633-2645, vol. 40, No. 12, © 2005 IEEE.

Lidong Chen, Fulvio Spagna, Phil Marzolf, John K. Wu, A 90nm 1-4.25-Gb/s Multi Data Rate Receiver for High Speed Serial Links, Nov. 2006, pp. 391-394, 0-7803-9735-5/06, IEEE Asian Solid-State Circuits Conference, © 2006 IEEE.

* cited by examiner

*Primary Examiner* — Henry Choe
(74) *Attorney, Agent, or Firm* — Roeder & Broder LLP

(57) ABSTRACT

An equalization system (18) that reduces inter-symbol interference in an input signal (220) includes a variable gain amplifier (430), and one or more peaking amplifiers (432) that are connected in series to the variable gain amplifier (430). The variable gain amplifier (430) receives the input signal (220) and scales the input signal (220) while each peaking amplifier (432) can be selectively controlled to selectively adjust a peaking gain (326) and a peaking corner frequency (328). Additionally, the equalization system (18) can include a PTAT bias generator (434) that provides a PTAT bias current to one or more of the peaking amplifiers (432) to maintain a transconductance of one or more of the peaking amplifiers (432) substantially constant as temperature changes. With this design, the equalization system (18) provides programmable and stabilized equalization gain, has a tunable peaking corner frequency, and superior common mode rejection.

21 Claims, 5 Drawing Sheets

EQUALIZATION SYSTEM WITH STABILIZED PEAKING GAIN FOR A COMMUNICATION SYSTEM

BACKGROUND

In communication systems, data is often transferred over one or more communication channels between two or more components. These components often include communication transceivers for receiving and transmitting data. Equalization amplifiers are commonly used in communication transceivers to compensate for a frequency dependent loss in the communication channels. For example, these equalization amplifiers, when used in binary serial transceivers, can reduce the inter-symbol interference ("ISI") caused by high-frequency losses in the communication channels. Unfortunately, existing equalization amplifiers do not always adequately reduce the inter-symbol interference over different corner, temperature and voltage supply conditions. As a result thereof, the communication transceiver that receives the transmitted data may have difficulty accurately recognizing the transmitted data. This can lead to data transmission errors.

SUMMARY

The present invention is directed to an equalization system that reduces inter-symbol interference in an input signal. In one embodiment, the equalization system includes a variable gain amplifier, and one or more peaking amplifiers that are connected in series to the variable gain amplifier. In this embodiment, the variable gain amplifier receives the input signal and scales the input signal. Further, each peaking amplifier selectively adjusts the peaking gain and the peaking corner frequency. With this design, the equalization system disclosed herein provides programmable and stabilized equalization gain, has a tunable peaking corner frequency, and superior common mode rejection.

In one embodiment, the equalization system additionally includes a PTAT bias generator that provides a PTAT bias current to one or more of the peaking amplifiers to maintain a transconductance of one or more of the peaking amplifiers substantially constant as temperature changes.

In certain embodiments, one or more of the peaking amplifiers includes a programmable shunt capacitor array having one or more capacitor paths, and if there are multiple capacitor paths, they are connected in parallel. Further, each capacitor path can include a variable capacitor and a capacitor switch that each can be selectively controlled to selectively control the capacitance of each capacitor path. Additionally, each capacitor path can include a resistor that is in series with a bias voltage that is applied to the variable capacitor when the capacitor switch is closed.

Moreover, in certain embodiments, one or more of the peaking amplifiers includes a programmable resistor array having one or more resistor paths and if there are multiple resistor paths, they are connected in parallel.

As provided herein, the variable gain amplifier can also be designed to convert the input signal from a PMOS type common mode to an NMOS type common mode signal. Moreover, the variable gain amplifier can be used to adjust a variable gain with bandwidth extension. In certain embodiments, the variable gain amplifier includes a pair of folded PMOS transistors, a programmable resistor array, and a shunt capacitor.

The present invention is also directed to a method for reducing inter-symbol interference in an input signal, the method including the steps of (i) scaling the input signal with a variable gain amplifier; and (ii) selectively adjusting the peaking gain and peaking corner frequency with a plurality of peaking amplifiers that are connected in series with the variable gain amplifier.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
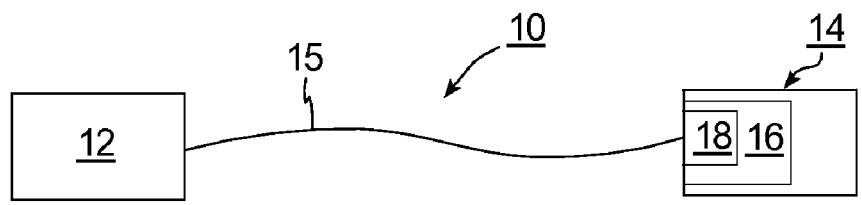
FIG. 1 is a simplified illustration of a communication system with an equalization system having features of the present invention.

FIG. 1 is a simplified illustration of one non-exclusive embodiment of a communication system 10 that includes a first component 12 (illustrated as a box), a second component 14 (illustrated as a box), and a communication channel 15 that electrically connects the components 12, 14 together. In this simplified illustration, the second component 14 includes a binary serial transceiver 16 (illustrated as a box) that transmits to and receives data from the first component 12 via the communication channel 15. Moreover, in this embodiment, the transceiver 16 includes an equalization system 18 (illustrated as a box) that (i) compensates for frequency dependent losses in the communication channel 15, (ii) effectively reduces any inter-symbol interference in an input signal 220 (illustrated in FIG. 2A) received by the transceiver 16 across different corner, temperature and voltage supply conditions, and (iii) improves the signal integrity of the input signal 220. As a result thereof, the communication transceiver 16 will receive and more accurately recognize the transmitted data.

The type of communication system 10 that utilizes the equalization system 18 provided herein can vary. For example, the communication system 10 can represent the serial communication between computers, or parts of a computer. As one non-exclusive example, the communication system 10 can represent the serial communication between a hard drive and central processing unit of a computer.

Figure 2A:
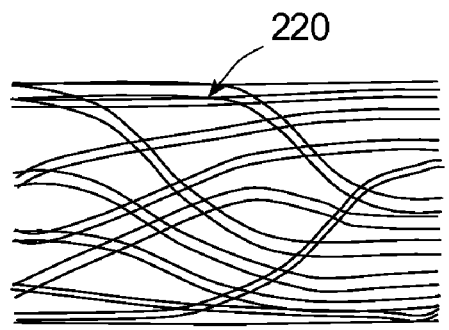
FIG. 2A is a simplified illustration of an input signal that is input into the equalization system of FIG. 1.
Figure 2B:
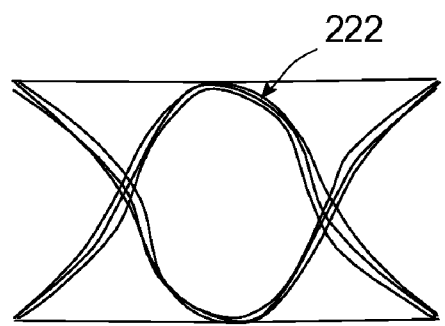
FIG. 2B is a simplified illustration of an output signal that is output from the equalization system of FIG. 1.

FIG. 2A illustrates a non-exclusive example of the input data signal 220 that is received by and input into the equalization system 18 (illustrated in FIG. 1), and FIG. 2B illustrates a non-exclusive example of an output data signal 222 that is output from the equalization system 18 to the rest of the transceiver 16 (illustrated in FIG. 1) of FIG. 1. Comparing the input signal 220 in FIG. 2A with the output signal 222 of FIG. 2B, after the equalization system 18, the eye diagram opening of the output data signal 222 has been enlarged significantly as compared to the input data signal 220. Thus, the equalization system 18 has removed the inter-symbol interference from the input signal 220. This makes it easier for the transceiver 16 to accurately recognize the transmitted information.

Figure 3:
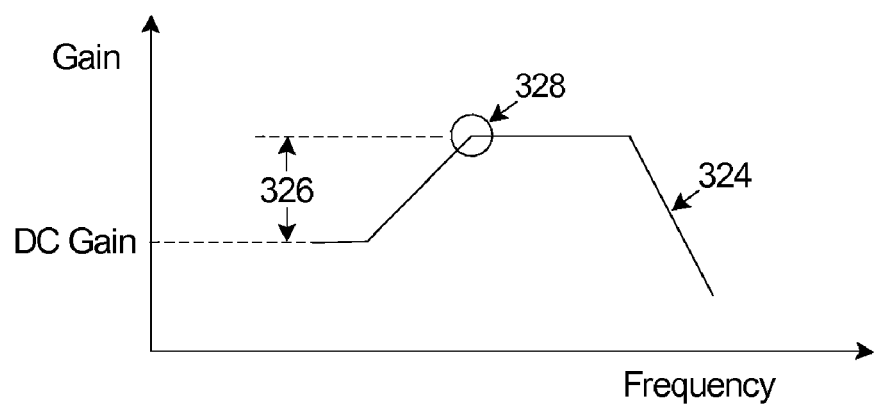
FIG. 3 is a graph that illustrates a gain curve.

FIG. 3 is a graph that illustrates a gain curve 324 that can be used to describe a number of the desired characteristics of the data signal. More specifically, there are a few critical performance specifications of the equalization system 18, such as DC gain, peaking gain 326, and peaking corner frequency 328. These features can be better understood with reference to FIG. 3. As provided herein, the equalization system 18 is uniquely designed to have programmability to adjust these performance parameters for different amount of channel loss and different data rates. Moreover, with the design provided herein, these electrical performance specifications are relatively stable across massive production quantities. Furthermore, the equalization system 18 provided herein is mostly implemented differentially. As a result thereof, the equalization system 18 rejects common mode input signal which is normally called common mode rejection.

As provided herein, the equalization system 18 disclosed herein provides programmable and stabilized equalization gain, has a tunable peaking corner frequency, and superior common mode rejection.

Figure 4:
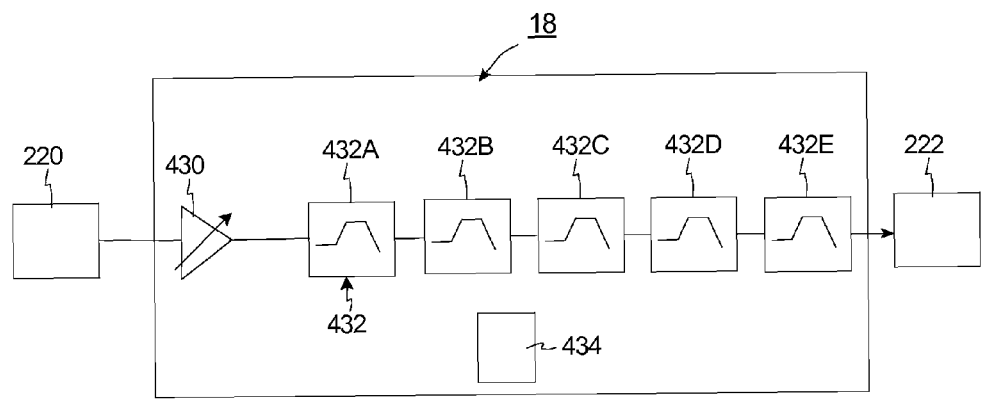
FIG. 4 is a simplified block diagram of one embodiment of an equalization system having features of the present invention that includes a variable gain amplifier, a plurality of peaking amplifiers, and a PTAT bias generator.

FIG. 4 is a simplified block diagram of one embodiment of the equalization system 18. In this embodiment, the equalization system 18 includes a variable gain amplifier ("VGA") 430, one or more peaking amplifiers 432, and a PTAT bias generator 434. In FIG. 4, the input signals 220 (illustrated as a box) are input into the equalization system 18 on the left of the block diagram, while the output signals 222 (illustrated as a box) exit the equalization system 18 on the right. In this embodiment, the input signals 220 initially enter the variable gain amplifier 430 and subsequently are directed to the cascading peaking amplifiers 432.

Figure 5:
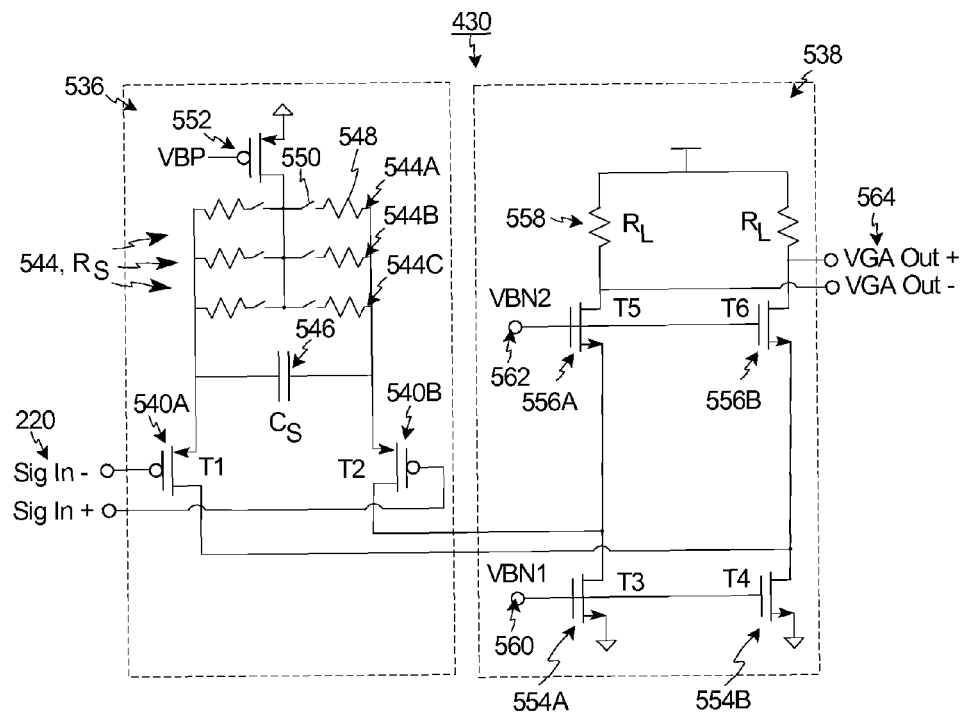
FIG. 5 is a simplified schematic that illustrates the electrical components of one embodiment of a variable gain amplifier having features of the present invention.

In certain embodiments, the variable gain amplifier 430 doesn't provide the equalization function by itself. In one embodiment, the variable gain amplifier 430 provided herein scales the amplitude of the input signals 220 to best fit the linear range of latter peaking amplifiers 432. One reason for this scaling function is that it is not desirable to have amplitude clamping in the linear peaking amplifiers 432. Additionally, in certain embodiments, the variable gain amplifier 430 also is designed to convert input common mode at ground level to a comfortable level for the latter stage N-type CML circuits used in the cascading peaking amplifiers 432. Thus, the variable gain amplifier 430 performs common mode translation by translating the input PMOS type common mode to an NMOS type common mode signal so that more efficient NMOS transistors (as opposed to PMOS transistors) can be used in the subsequent peaking amplifiers 432. Additionally, in certain embodiments, the variable gain amplifier 430 also adjusts the variable gain and performs bandwidth extension. Moreover, these functions can be implemented at same time with the variable gain amplifier 430. The design scheme of one suitable variable gain amplifier 430 is illustrated in FIG. 5 and described below.

The plurality of cascading peaking amplifiers 432 are used to provide a relatively large range of adjustment of the peaking gain and the peaking corner frequency. As a non-exclusive example, the multiple cascading peaking amplifiers can be used together to realized a peaking gain of up to approximately twenty-four decibels (24 dB). With this design, the total peaking gain of the equalization system 18 is adjusted in a step-wise fashion by adjusting the peaking gain of each of the cascading peaking amplifiers 432.

Figure 6:
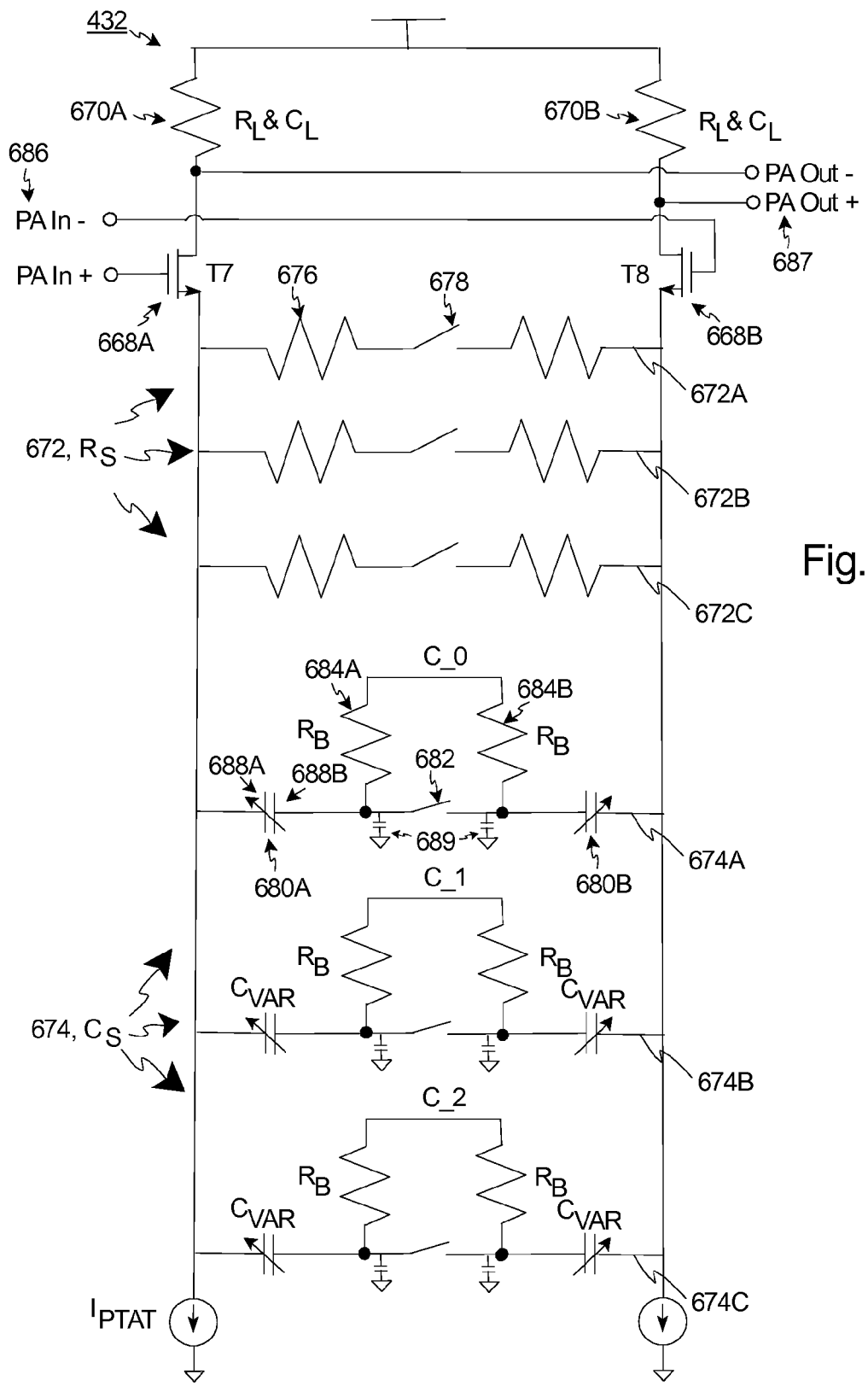
FIG. 6 is a simplified schematic that illustrates the electrical components of one embodiment of a peaking amplifier having features of the present invention.

The number of peaking amplifiers 432 used in the equalization system 18 can be varied to achieve the design and adjustment requirements of the equalization system 18. In FIG. 4, the equalization system 18 including five peaking amplifiers 432 that are connected in series. These peaking amplifiers 432 are labeled 432A-432E for reference and can be referred to as first, second, third, fourth and fifth peaking amplifiers. Alternatively, the equalization system 18 can be designed to include more than five or fewer than five peaking amplifiers 432. The design scheme of a suitable peaking amplifier 432 is illustrated in FIG. 6 and described below.

As provided in more detail below, each peaking amplifier 432 includes a programmable resistor array Rs and a programmable shunt capacitor array Cs. As provided herein, the total peaking gain of the equalization system 18 is adjusted by changing the peaking gain of each peaking amplifier 432. Further, the peaking gain of each peaking amplifier 432 is adjusted by changing the value of the resistance of the programmable resistor array Rs and the capacitance of the programmable shunt capacitor array. Therefore, by tweaking the programmable resistor array Rs and the programmable shunt capacitor array Cs of each peaking amplifier 432, the total peaking gain can be adjusted and controlled in small steps, to best fit different channel loss.

Figure 8:
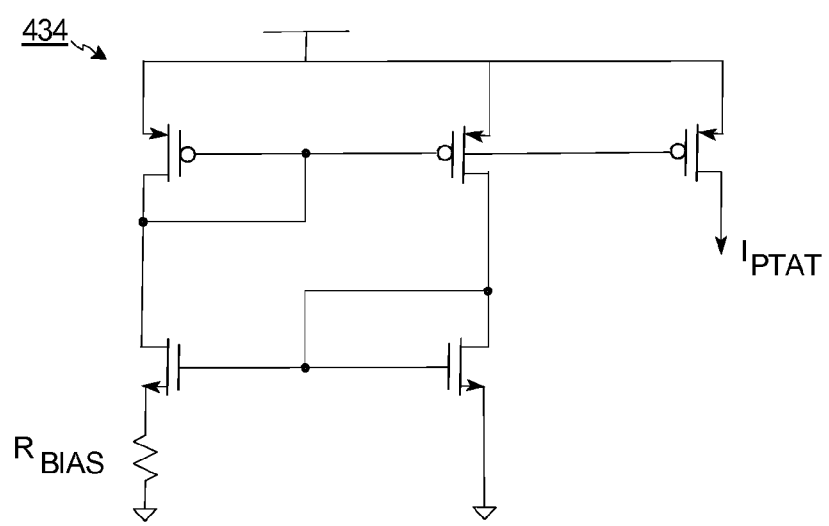
FIG. 8 is a simplified schematic that illustrates the components of one embodiment of a PTAT bias generator having features of the present invention.

The PTAT bias generator 434 is electrically connected to each of the peaking amplifiers 432 and is used to bias each of the peaking amplifiers 432. In certain embodiments, the PTAT bias generator 434 is designed to provide a PTAT biasing current that increases proportionally with temperature to each of the peaking amplifiers 432. The design scheme of one suitable PTAT bias generator 434 is illustrated in FIG. 8 and is described below. Alternatively, the equalization 18 system can be designed so that each of the peaking amplifiers 432 is biased by a separate PTAT bias generator.

FIG. 5 is a simplified schematic that illustrates the components of one embodiment of the variable gain amplifier 430. In one embodiment, the variable gain amplifier 430 is implemented with a first circuit portion 536 (illustrated with a dashed line) and a second circuit portion 538 (illustrated with a dashed line). In this embodiment, the first circuit portion 536 includes (i) a pair of folded P-MOS input transistors T1 540A, T2 540B, (ii) a programmable resistor array Rs 544, and (iii) a shunt capacitor Cs 546.

In this embodiment, the pair of folded P-MOS input transistors T1 540A, T2 540B receive the input signal 220, and the P-MOS input transistors T1 540A, T2 540B are source degenerated with the programmable resistor array Rs 544. Further, the programmable resistor array Rs 544 can be controlled to simultaneously adjust the variable gain.

The design of the programmable resistor array Rs 544 can be varied to achieve the desired level of source degeneration and variable gain. In FIG. 5, the programmable resistor array Rs 544 includes a first resistor path 544A, a second resistor path 544B, and a third resistor path 544C, and the resistor paths 544A-544C are connected in parallel with each other, and the programmable resistor array Rs 544 is in series with the P-MOS input transistors T1 540A, T2 540B. Further, in FIG. 5, each resistor path 544A-544C includes a spaced apart pair of resistors 548 and a pair of spaced apart resistor switches 550. In one embodiment, (i) for each resistor path 544A-544C, both resistor switches 550 are controlled to be opened or closed concurrently, and (ii) each resistor path 544A-544C can be individually controlled to selectively control the overall resistance value of the programmable resistor array Rs 544. As non-exclusive example, the resistor paths 544A-544C can be controlled so that the programmable resistor array Rs 544 has an overall resistance of between approximately one hundred and three hundred ohms. Alternatively, the system can designed so that the programmable resistor array Rs 544 has higher or lower overall resistance.

Further, a suitable resistor switch 550 can be a transistor having a gate that can be selectively opened and closed. As non-exclusive examples, the programmable resistor array Rs 544 of the variable gain amplifier 430 can be used to adjust the variable gain at least approximately ten, twenty, fifty or one-hundred percent.

Alternatively, the programmable resistor array Rs 544 can be designed to have more than three or fewer than three resistor paths 544A-544C, and/or each resistor path 544A-544C can include more than or fewer than two resistors 548.

Additionally, in FIG. 5, the first circuit portion 536 includes a bias voltage VBP 552 that is connected in series with each resistor path 544A-544C. In this embodiment, the bias voltage VBP 552 is used for biasing the pair of PMOS transistors T1 540A, T2 540B and causing the respective transistors to operate in a particular region of their transconductance curve. As provided herein, the DC bias voltage VBP 552 is independent from the input signal 220.

The shunt capacitor Cs 546 is used to boost the high frequency gain for bandwidth extension. In FIG. 5, the shunt capacitor Cs 546 is connected in parallel with the resistor paths 544A-544C and in series with the PMOS transistors T1 540A, T2 540B. A non-exclusive example, of a suitable shunt capacitor Cs 546 has a capacitance of approximately 100 centumfarad. As a non-exclusive example, the shunt capacitor Cs 546 of the variable gain amplifier 430 can be used to boost the bandwidth of variable gain amplifier 430 at least approximately forty percent.

In FIG. 5, input signal 220 (Sig In+, Sig In−) is initially directed to the pair of PMOS transistors T1 540A, T2 540B of the first circuit portion 536. Subsequently, the folded P-MOS transistors T1 540A, T2 540B steer the current into the second circuit portion 538. In FIG. 5, the second circuit portion 538 includes (i) a first pair of NMOS transistors T3 554A, T4 554B, (ii) a second pair of NMOS transistors T5 556A, T6 556B, (iii) a pair of load resistors RL 558, (iv) a first DC bias voltage 560 connected to the first pair of NMOS transistors T3 554A, T4 554B, for biasing the first pair of NMOS transistors T3 554A, T4 554B and causing the respective transistors to operate in a particular region of their transconductance curve, and (v) a second DC bias voltage 562 connected to the second pair of NMOS transistors T5 556A, T6 556B, for biasing the second pair of NMOS transistors T5 556A, T6 556B and causing the respective transistors to operate in a particular region of their transconductance curve. As provided herein, the first and second DC bias voltages 560, 562 are independent from the input signal 220.

In this embodiment, the second circuit portion 538 performs common mode translation by translating the input PMOS type common mode to an NMOS type common mode signal.

In FIG. 5, the VGA output signal 564 (VGA Out+, VGA Out−) is taken between the load resistors RL 558 and second pair of NMOS transistors T5 556A, T6 556B, and is subsequently directed to the latter peaking amplifiers 432 (illustrated in FIG. 4). It should be noted that, in certain embodiments, the VGA output signal 564 exiting from the variable gain amplifier 430 (i) has been scaled, (ii) has been converted to an NMOS type common mode signal, (iii) the high frequency gain has been boosted, and (iv) the bandwidth has been extended.

FIG. 6 is a simplified schematic that illustrates the components of one embodiment of a peaking amplifier 432 having features of the present invention. It should be noted that one or more of the peaking amplifiers 432A-432E (illustrated in FIG. 4) can have a design similar to that illustrated in FIG. 6. As discussed above, the peaking amplifiers 432 are cascaded for relatively large range of peaking gain adjustment, with each individual peaking amplifier providing a controllable in size step-wise adjustment to the peaking gain, and the overall adjustment in the peaking gain being a summation of the step-wise adjustments from the individual peaking amplifiers 432A-432E.

In FIG. 6, the peaking amplifier 432 is an N-type current-mode-logic amplifier with resistive source degeneration and capacitive shunt path for high frequency peaking. In FIG. 6, the peaking amplifier 432 includes (i) a pair of NMOS transistors T7 668A, T8 668B; (ii) a pair of load resistors $R_L$ 670A, 670B that also have a capacitance of $C_L$; (iii) a programmable resistor array $R_s$ 672; and (iv) a shunt capacitor array $C_s$ 674.

As provided herein, the pair of load resistors $R_L$ 670A, 670B can be used to in conjunction with the NMOS transistors T7 668A, T8 668B to control the peaking gain of the peaking amplifier 432. These load resistors $R_L$ 670A, 670B are connected in series with the NMOS transistors T7 668A, T8 668B. A non-exclusive example of a suitable load resistor $R_L$ 670A, 670B has a resistance of approximately one hundred ohms, a capacitance of approximately thirty sF.

The programmable resistor array $R_s$ 672 can be used to suppress degeneration, and is used in conjunction with the shunt capacitor array $C_s$ 674 to adjust the gain of the signal. The design of the programmable resistor array $R_s$ 672 can be varied to achieve the desired level of adjustment of the variable gain. In FIG. 6, the programmable resistor array $R_s$ 672 includes a first resistor path 672A, a second resistor path 672B, and a third resistor path 672C, and the resistor paths 672A-672C are connected in parallel with each other. Further, in FIG. 6, each resistor path 672A-672C includes a spaced apart pair of resistors 676 and a resistor switch 678. In one embodiment, the resistor switch 678 of each resistor path 672A-672C can be individually controlled to selectively control the overall resistance of the programmable resistor array $R_s$ 672. As a non-exclusive example, the resistor paths 672A-672C can be individually controlled so that the programmable resistor array Rs 672 has an overall resistance of between approximately one hundred and three hundred ohms. Alternatively, the system can designed so that the programmable resistor array Rs 672 has higher or lower overall resistance.

A non-exclusive example of a suitable resistor 676 for each resistor path 672A-672C can be a poly resistor having a resistance of approximately two hundred ohms. Further, a suitable resistor switch 678 can be a transistor having a gate that can be selectively opened and closed.

Alternatively, the programmable resistor array $R_s$ 672 can be designed to have more than three or fewer than three resistor paths 672A-672C, and/or each resistor path 672A-672C can include more than or fewer than two resistors 676.

The shunt capacitor array $C_s$ 674 is used to provide a wide tuning range of peaking corner frequency with a large tuning ratio of shunt capacitors. This wide tuning range is a desired feature since designers want to cover a variety of data rates. Moreover, lower data rate requires lower corner frequency. The design of the shunt capacitor array $C_s$ 674 can be varied to achieve the desired level of tuning range of the peaking corner frequency. In FIG. 6, the shunt capacitor array $C_s$ 674 includes a first capacitor path 674A, a second capacitor path 674B, and a third capacitor path 674C; and the capacitor paths 674A-672C are connected in parallel with each other. Each capacitor path 674A-674C can be individually controlled to provide a controlled amount of capacitance for the shunt capacitor array $C_s$ 674. Moreover, each capacitor paths 674A-672C is connected in parallel with each resistor path 672A-672C.

In one embodiment, each capacitor path 674A-672C includes a pair of variable capacitors $C_{var}$ 680A, 680B, a capacitor switch 682, and a pair of resistors $R_B$ 684A, 684B. In FIG. 6, for each capacitor path 674A-672C, (i) the pair of resistors $R_B$ 684A, 684B are in series, the bias voltage for the variable capacitors $C_{var}$ 680A, 680B are connected in series with the resistors $R_B$ 684A, 684B when the serial capacitor switch 682 is closed. In one embodiment, the capacitor switch 682 of each capacitor path 674A-674C can be individually controlled to selectively control the overall capacitance of the programmable capacitor array $C_s$ 674.

Alternatively, the shunt capacitor array $C_s$ 674 can be designed to have more than three or fewer than three capacitor paths 674A-672C, and/or one or more of the capacitor paths 674A-672C can have a different design than that illustrated in FIG. 6.

In FIG. 6, a PA input signal 686 (PA In+, PA In−) is directed to the pair of NMOS transistors T7 668A, T8 668. It should be noted that if the peaking amplifier 432 of FIG. 6 is the first peaking amplifier 432A (illustrated in FIG. 4), that the PA input signal 686 is same at the VGA output signal 564 (illustrated in FIG. 5) from the variable gain amplifier 430 (illustrated in FIG. 4). Alternatively, if the peaking amplifier 432 of FIG. 6 is a subsequent one of the cascading peaking amplifiers 432B-432E, the PA input signal 686 is the same as the PA output signal 687 from the previous one of the cascading peaking amplifiers 432A-432D.

As provided herein, the DC gain of the PA input signal 686 is suppressed by degeneration by programmable resistor array $R_s$ 672, and, in high frequency, the gain is restored with variable capacitors $C_{Var}$ 680A, 680B in shunt with the resistors $R_B$ 684A, 684B

In FIG. 6, with this design of the peaking amplifier 432, the degeneration load resistors $R_L$ 670A, 670B and the transconductance (gm) of the NMOS transistors T7 668A, T8 668B control the peaking gain of the peaking amplifier 432.

Further, the programmable resistor array $R_s$ 672, the shunt capacitor array $C_s$ 674, and the transconductance (gm) of the NMOS transistors T7 668A, T8 668 together decide the peaking corner frequency of output signal from the peaking amplifier 432. Their relationship can be roughly represented by Equations 1-3.

$$H(s) = \frac{g_m R_L}{1 + sR_L C_L} \cdot \frac{1 + sR_s C_s}{1 + g_m R_s + sR_s C_s} \quad \text{Equation 1}$$

$$\text{Peaking Gain} \approx 1 + g_m R_s \quad \text{Equation 2}$$

$$\text{Peaking Corner Frequency} \approx \frac{1 + g_m R_s}{R_s C_s} \quad \text{Equation 3}$$

In equations 1-3, (i) H(s) represents the transfer function in the Laplace domain, (ii) s represents a complex variable, (iii) $R_s$ is the resistance of the programmable resistor array 672, (iv) $C_s$ is the capacitance of the programmable capacitor array 674, (v) $G_m$ is the transconductance of the NMOS transistors T7 668A, T8 668, (vi) $R_L$ is the resistance of the load resistors 670A, 670B, and (vii) $C_L$ is the capacitance of the load resistors 670A, 670B.

From Equations 1-3, it is straight forward to determine the following conclusions: (i) the peaking gain can be adjusted by changing the resistance of the programmable resistor array $R_s$ 672; (ii) the peaking corner frequency can be adjusted by changing the capacitance of the shunt capacitor array $C_s$ 674; and (iii) the peaking gain can be disabled by disconnecting the shunt capacitor array $C_s$ 674. Moreover, these equations show how to keep the peaking gain and the peaking corner frequency stable during changes in PVT. Semiconductor devices are subject to many variations such as manufacturing skew corners, temperature and voltage supply. These three dominant factors are also known as PVT variation. All these factors contribute to the change of the performance of the equalization amplifier. By stabilizing and correlating the value of transconductance $G_m$ to resistor value, the stabilization of the peaking gain and the corner frequency can be achieved. Thus, the present invention is effective in removing the inter-symbol interference across different corner, temperature and voltage supply conditions. Moreover, the present invention is provides superior common mode rejection.

As provided herein, the peaking gain from each individual peaking amplifier 432 can be adjusted by changing the value of programmable resistor array $R_s$ 672 and value of the shunt capacitor array $C_s$ 674. Therefore, by tweaking the value of programmable resistor array $R_s$ 672 and value of the shunt capacitor array $C_s$ 674 for each individual peaking amplifier 432, each individual peaking amplifier 432 can be used to make a relatively small, step-wise controllable adjustment in gain. However, with the use of the cascading of multiple peaking amplifiers 432A-432E (illustrated in FIG. 4), the step-wise gains are summed, and the overall gain of the equalization system 18 can be controlled to obtain a relatively large total gain (e.g. total 24 dB gain) at a controlled small step, to best fit different channel loss in the communication system 10.

As non-exclusive examples, each peaking amplifier 432A-432E can be used to make a step-wise gain of at least approximately 1, 2, 3, 4, 5, or 6 dB. With these non-exclusive examples, with five cascading peaking amplifiers 432A-432E, the system can make an adjustment in gain of at least approximately 5, 10, 15, 20, 25, or 30 dB. It should be noted that these adjustments can be made in any step wise increment smaller or larger than the examples provided herein.

In one embodiment, the variable capacitors $C_{var}$ 680A, 680B are implemented with a varactor. For a varactor, its capacitance density is much higher than metal capacitor and the capacitance changes monotonically with the voltage across its gate node 688A and its bulk node 688B across a wide voltage range. The location of the gate node 688A and the bulk node 688A of one of the variable capacitors $C_{var}$ 680A, 680B is illustrated in FIG. 6

A non-exclusive example of a suitable variable capacitor $C_{VAR}$ 680A, 680B for each capacitor path 674A-672B has a capacitance that varies between one Pico farad and ten Pico farad.

Figure 7:
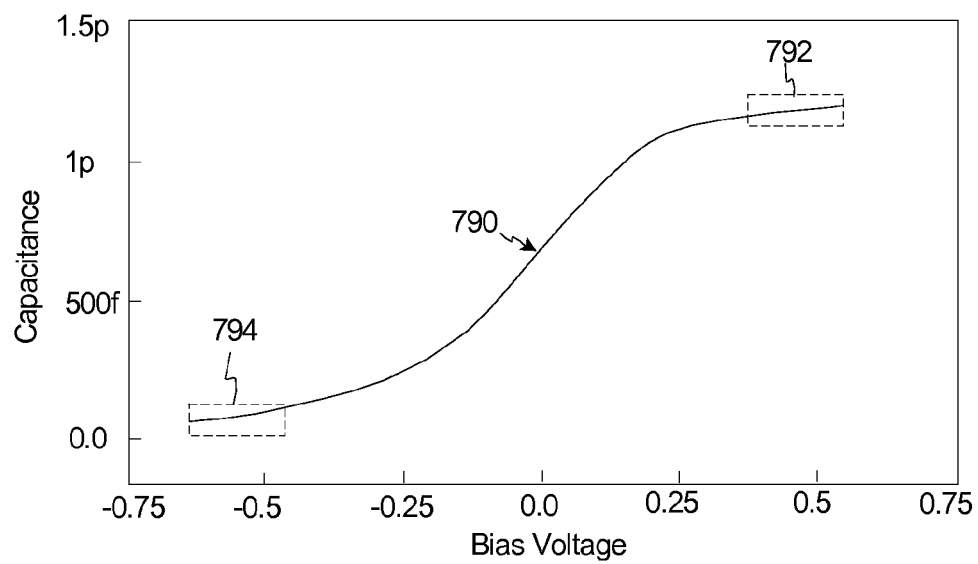
FIG. 7 is a graph that illustrates capacitance-bias voltage ("C-V") curve for a varactor having features of the present invention.

FIG. 7 is a graph that illustrates capacitance-bias voltage ("C-V") curve 790 for one embodiment of a varactor that can be used in the variable capacitors $C_{VAR}$ 680A, 680B of FIG. 6. As illustrated in FIG. 7, the capacitance of the varactor increases as the bias voltage applied across the gate and bulk nodes of the varactor increases. Further, in FIG. 7, the C-V curve 790 includes a first zone 792 (illustrated with dashed box) and a second zone 794 (illustrated with dashed box) in which the capacitance of the varactor is fairly constant with its bias voltage. Moreover, the capacitance is not fairly constant between the two zones 792, 794 as the bias voltage varies. As provided herein, the bias voltage to each varactor can be selectively controlled so that the varactor is operating in either the first zone 792, the second zone 794, or somewhere therebetween. When the varactor is controlled to be in the first zone 792 it has a relatively high capacitance; and when the varactor is controlled to be in the second zone 794 it has a relatively low capacitance. With this design, the bias voltage applied to the varactors can be used to control the capacitance of the variable capacitors $C_{VAR}$ 680A, 680B.

Referring back to FIG. 6, with the present invention, the peaking amplifier 432 adjusts the peaking corner frequency by changing value of the shunt capacitor array $C_s$ 674. As provided herein, this feature can be realized with doing two adjustments at the same time to each individual capacitor path 674A-674C. One adjustment is turning on/off (opening/closing) the capacitor switch 682 that is in series with the variable capacitors $C_{var}$ 680A, 680B for each individual capacitor path 674A-674C. The other is to change a bias voltage applied to the variable capacitors $C_{var}$ 680A, 680B for each individual capacitor path 674A-674C. In FIG. 6, (i) a first bias voltage C_0 can be selectively applied (by a first bias voltage source to the area between the resistors $R_B$ 684A, 684B of the first capacitor path 674A) to the variable capacitors $C_{var}$ 680A, 680B of the first capacitor path 674A, (ii) a second bias voltage C_1 can be selectively applied (by a second bias voltage source to the area between the resistors $R_B$ 684A, 684B of the second capacitor path 674B) to the variable capacitors $C_{var}$ 680A, 680B of the second capacitor path 674B, and (iii) a third bias voltage C_2 can be selectively applied (by a third bias voltage source to the area between the resistors $R_B$ 684A, 684B of the third capacitor path 674C) to the variable capacitors $C_{var}$ 680A, 680B of the third capacitor path 674C. Doing these two adjustments at the same time can minimize the impact from the parasitic capacitance from the capacitor switch 682 in series with the variable capacitors $C_{var}$ 680A, 680B, and therefore maximize the tuning range of shunt capacitor array $C_s$ 674.

For each individual capacitor path 674A-674C, by selectively connecting/disconnecting the serial capacitor switch 682, the variable capacitors $C_{var}$ 680A, 680B are connected in parallel with the programmable resistor array $R_s$ 672 or disconnected. Further, for each individual capacitor path 674A, 674B, (i) the bias voltage applied to the variable capacitors $C_{var}$ 680A, 680B is connected in series with the resistors $R_B$ 684A, 684B when the serial capacitor switch 682 is closed.

By changing the bias voltage, the capacitance value of the variable capacitors $C_{var}$ 680A, 680B is changed (as illustrated in FIG. 7). Thus, by changing the bias voltage at C_0, C_1, C_2, the capacitance value for each individual capacitor path 674A-674C can be individually tuned and adjusted.

A suitable capacitor switch 682 can be a transistor having a gate that can be selectively opened and closed. Further, the parasitic cap 689 of the capacitor switch 682 is also illustrated in FIG. 6.

In one embodiment, for each capacitor path 674A-674C, (i) when the respective bias voltage (C_0, C_1, C_2) is at ground, and when the capacitor switch 683 is closed, the varactor has a relatively high capacitance, and (ii) when, the respective bias voltage (C_0, C_1, C_2) is not at ground, and when the capacitor switch 683 is open, the varactor has a relatively low capacitance. This provides high tuning range for the capacitor paths 674A-674C that can be individually tuned by selectively controlling the capacitor switch 683 and the bias voltage (C_0, C_1, C_2) for each capacitor path 674A-674C.

As provided herein, the resistors $R_B$ 684A, 684B of each individual capacitor path 674A-674C is used to block the signal path from the variable capacitors $C_{var}$ 680A, 680B to the respective low impedance bias voltage sources C_0, C_1, C_2. This can boost the common mode impedance of the variable capacitors $C_{var}$ 680A, 680B and improve the common mode rejection characteristics of the peaking amplifier 432. A non-exclusive example of a suitable resistor $R_B$ 684A, 684B for each capacitor path 674A-672B has a resistance of between approximately five and twenty kilo ohms.

In FIG. 6, the PA output signal 687 (PA Out+, PA Out−) is taken between the NMOS transistors T7 668A, T8 668 and the load resistors $R_L$ 670A, 670B.

Additionally, in the embodiment illustrated in FIG. 6, the peaking amplifier 432 receives a PTAT bias current $I_{BIAS}$ from the PTAT bias generator 434 (illustrated in FIG. 6). As provided above, the PTAT bias generator 434 is electrically connected to each of the peaking amplifiers 432 and is used to bias the NMOS transistors T7 668A, T8 668 of each of the peaking amplifiers 432. In certain embodiments, the PTAT bias generator 434 is designed to provide a PTAT biasing current having a value that increases proportionally with temperature. With this design, the PTAT bias current $I_{BIAS}$ can be used to maintain the transconductance $G_m$ of the NMOS transistors T7 668A, T8 668 substantially constant as temperature changes. This feature reduces the influence of temperature on each peaking amplifier 432.

FIG. 8 is a simplified schematic that illustrates the components of one, non-exclusive embodiment a suitable the PTAT bias generator 434. In FIG. 8, the PTAT bias generator 434 generates a reference bias current $I_{BIAS}$ that is proportional to temperature, inversely proportional to $R_{BIAS}$, and does not change with the power supply. With the help of PTAT bias current $I_{BIAS}$, the value of the transconductance $G_m$ of the NMOS transistors T7 668A, T8 668 of the peaking amplifiers 432 is kept approximately constant with temperature change.

Figure 9:
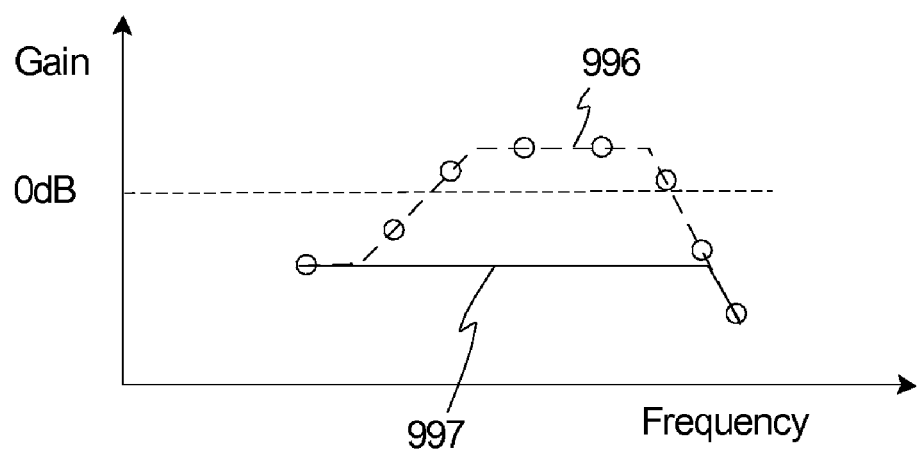
FIG. 9 is a graph that illustrates two alternative common mode gain curves.

FIG. 9 is a graph that illustrates two alternative common mode gain curves, namely a first common mode gain curve 996 (illustrated with a long dashed line and circles), and a second common mode gain curve 997 (illustrated with a solid line). As discussed above and illustrated in FIG. 6, the resistors $R_B$ 684A, 684B of each individual capacitor path 674A-674C are used to block the signal path from the variable capacitors $C_{var}$ 680A, 680B to the respective low impedance bias voltage C_0, C_1, C_2. This can boost the common mode impedance of the variable capacitors $C_{var}$ 680A, 680B and improve the common mode rejection characteristics of the peaking amplifier 432.

Referring back to FIG. 9, (i) the first common mode gain curve 996 represents the results from a peaking amplifier (not shown) that does not use the resistors $R_B$ 684A, 684B in the capacitor paths 674A-674C; and (ii) the second common mode gain curve 997 represents the results from a peaking amplifier 432 (illustrated in FIG. 6) that uses resistors $R_B$ 684A, 684B in the capacitor paths 674A-674. It should be noted that the first common mode gain curve 996 has an undesirable peaking higher frequency, while the second common mode gain curve 997 does not have the peaking higher frequency. Thus, the resistors $R_B$ 684A, 684B improve the common mode rejection characteristics of the peaking amplifier 432.

Figure 10:
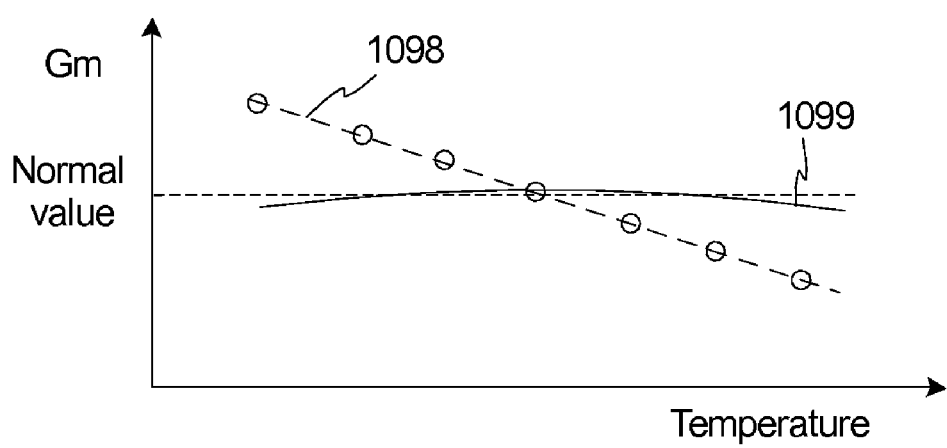
FIG. 10 is a graph that illustrates a constant biasing current curve and a PTAT biasing current curve.

FIG. 10 illustrates a constant biasing current curve 1098 (illustrated with a long dashed line and circles) and a PTAT biasing current curve 1099 (illustrated with a solid line) that can be generated by the PTAT bias generator 434 illustrated in FIG. 8. With the constant biasing current curve 1098, the transconductance $G_m$ varies greatly as temperature changes. In contrast, with the PTAT biasing current curve 1099, the transconductance $G_m$ is substantially constant (varies less than approximately plus or minus five or ten percent over the operational temperature range of the system) as temperature changes. In certain non-exclusive embodiments, from simulation, it has been proven that using the PTAT biasing current curve 1099 for the peaking amplifiers 432 can reduce the gain variation from plus or minus forty percent to plus or minus ten percent (+/−40% to +/−10%). This significant improvement mainly comes from the stabilized performance over different temperatures.

While the particular invention as herein shown and disclosed in detail are fully capable of obtaining the objectives and providing the advantages herein before stated, it is to be understood that they are merely illustrative of one or more embodiments and that no limitations are intended to the details of construction or design herein shown other than as described in the appended claims.

What is claimed is:

1. An equalization system that reduces inter-symbol interference in an input signal, the equalization system comprising:
    a variable gain amplifier that receives the input signal, the variable gain amplifier scaling the input signal;
    a plurality of peaking amplifiers connected in series with the variable gain amplifier, each peaking amplifier selectively adjusting the peaking gain and peaking corner frequency; and
    a PTAT bias generator that provides a PTAT bias current to at least one of the peaking amplifiers to maintain a transconductance of the at least one peaking amplifier substantially constant as temperature changes.

2. The equalization system of claim 1 wherein the PTAT bias generator provides a PTAT bias current to each of the peaking amplifiers to maintain a transconductance of each of the peaking amplifiers substantially constant as temperature changes.

3. An equalization system that reduces inter-symbol interference in an input signal, the equalization system comprising:
    a variable gain amplifier that receives the input signal, the variable gain amplifier scaling the input signal; and
    a plurality of peaking amplifiers connected in series with the variable gain amplifier, each peaking amplifier selectively adjusting the peaking gain and peaking corner frequency; wherein at least one of the peaking amplifiers includes a programmable shunt capacitor array having at least one capacitor path, and wherein each capacitor path includes a variable capacitor and a capacitor switch that each can be selectively controlled to selectively control the capacitance of the each capacitor path.

4. The equalization system of claim 3 wherein each variable capacitor is a varactor.

5. The equalization system of claim 3 wherein each capacitor path includes a resistor that is in series with a bias voltage that is applied to the variable capacitor when the capacitor switch is closed.

6. An equalization system that reduces inter-symbol interference in an input signal, the equalization system comprising:
    a variable gain amplifier that receives the input signal, the variable gain amplifier scaling the input signal; and
    a plurality of peaking amplifiers connected in series with the variable gain amplifier, each peaking amplifier selectively adjusting the peaking gain and peaking corner frequency; wherein at least one of the peaking amplifiers includes a programmable resistor array having at least one resistor path.

7. An equalization system that reduces inter-symbol interference in an input signal, the equalization system comprising:
    a variable gain amplifier that receives the input signal, the variable gain amplifier scaling the input signal; wherein the variable gain amplifier converts the input signal from a PMOS type common mode to an NMOS type common mode signal; and
    a plurality of peaking amplifiers connected in series with the variable gain amplifier, each peaking amplifier selectively adjusting the peaking gain and peaking corner frequency.

8. The equalization system of claim 1 wherein the variable gain amplifier adjusts a variable gain with an extended bandwidth of the variable gain amplifier.

9. An equalization system that reduces inter-symbol interference in an input signal, the equalization system comprising:
    a variable gain amplifier that receives the input signal, the variable gain amplifier scaling the input signal; wherein the variable gain amplifier includes a pair of folded PMOS transistors, a programmable resistor array, and a shunt capacitor; and
    a plurality of peaking amplifiers connected in series with the variable gain amplifier, each peaking amplifier selectively adjusting the peaking gain and peaking corner frequency.

10. An equalization system that reduces inter-symbol interference in an input signal, the equalization system comprising:
    a variable gain amplifier that receives the input signal, the variable gain amplifier scaling the input signal;
    a peaking amplifier connected in series with the variable gain amplifier, the peaking amplifier including a transducer; and
    a PTAT bias generator that provides a PTAT bias current to the peaking amplifier to maintain a transconductance of the transducer substantially constant as temperature changes.

11. The equalization system of claim 10 wherein the peaking amplifier includes a programmable shunt capacitor array having at least one capacitor path, and wherein each capacitor path includes a variable capacitor and a capacitor switch that each can be selectively controlled to selectively control the capacitance of the each capacitor path.

12. The equalization system of claim 11 wherein each capacitor path includes a resistor that is in series with a bias voltage that is applied to the variable capacitor when the capacitor switch is closed.

13. The equalization system of claim 10 the peaking amplifier includes a programmable resistor array having at least one resistor path.

14. The equalization system of claim 10 wherein the variable gain amplifier converts the input signal from a PMOS type common mode to an NMOS type common mode signal.

15. The equalization system of claim 14 wherein the variable gain amplifier adjusts a variable gain with an extended bandwidth of the variable gain amplifier.

16. The equalization system of claim 15 wherein the variable gain amplifier includes a pair of folded PMOS transistors, a programmable resistor array, and a shunt capacitor.

17. A method for reducing inter-symbol interference in an input signal, the method including the steps of:
  scaling the input signal with a variable gain amplifier;
  selectively adjusting the peaking gain and peaking corner frequency with a plurality of peaking amplifiers connected in series with the variable gain amplifier; and
  providing a PTAT bias current to at least one of the peaking amplifiers to maintain a transconductance of the at least one peaking amplifier substantially constant as temperature changes.

18. A method for reducing inter-symbol interference in an input signal, the method including the steps of:
  scaling the input signal with a variable gain amplifier; and
  selectively adjusting the peaking gain and peaking corner frequency with a plurality of peaking amplifiers connected in series with the variable gain amplifier; wherein the step of selectively adjusting the peaking gain and peaking corner frequency of the input signal includes the step of providing for at least one of the peaking amplifiers (i) a programmable shunt capacitor array having a first capacitor path and a second capacitor path that are connected in parallel, and wherein each capacitor path includes a variable capacitor and a capacitor switch that each can be selectively controlled to selectively control the capacitance of the each capacitor path, and (ii) a programmable resistor array having a first resistor path and a second resistor path that are connected in parallel.

19. The method of claim 18 wherein each capacitor path includes a resistor that is in series with a bias voltage that is applied to the variable capacitor when the capacitor switch is closed.

20. A method for reducing inter-symbol interference in an input signal, the method including the steps of:
  scaling the input signal with a variable gain amplifier;
  selectively adjusting the peaking gain and peaking corner frequency with a plurality of peaking amplifiers connected in series with the variable gain amplifier; and
  converting the input signal from a PMOS type common mode to an NMOS type common mode signal with the variable gain amplifier.

21. The method of claim 17 further comprising the step of adjusting a variable gain an extended bandwidth with the variable gain amplifier.

\* \* \* \* \*